United States Patent
Chiu et al.

(10) Patent No.: US 10,319,456 B2
(45) Date of Patent: Jun. 11, 2019

(54) APPARATUS AND METHOD FOR MEASURING PERFORMANCE OF MEMORY ARRAY

(71) Applicant: Taiwan Semiconductor Manufacturing Co., Ltd., Hsinchu (TW)

(72) Inventors: Chi-Hsu Chiu, Taipei (TW); Shih-Feng Huang, Taoyuan (TW); Yi-Sin Wang, Tainan (TW); Arjit Ashok, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/879,455

(22) Filed: Jan. 25, 2018

(65) Prior Publication Data

US 2019/0066815 A1 Feb. 28, 2019

Related U.S. Application Data

(60) Provisional application No. 62/551,248, filed on Aug. 29, 2017.

(51) Int. Cl.
| | |
|---|---|
| *G11C 7/00* | (2006.01) |
| *G11C 29/00* | (2006.01) |
| *G11C 29/14* | (2006.01) |
| *G11C 29/02* | (2006.01) |
| *G01R 31/27* | (2006.01) |

(Continued)

(52) U.S. Cl.
CPC .......... *G11C 29/14* (2013.01); *G01R 31/2601* (2013.01); *G01R 31/275* (2013.01); *G11C 29/006* (2013.01); *G11C 29/023* (2013.01); *G11C 29/38* (2013.01); *G11C 29/50* (2013.01)

(58) Field of Classification Search
CPC ..... G11C 29/14; G11C 29/006; G11C 29/023; G11C 29/38; G11C 29/50; G01R 31/2601; G01R 31/275
See application file for complete search history.

(56) References Cited

U.S. PATENT DOCUMENTS

| | | | |
|---|---|---|---|
| 7,394,708 B1 * | 7/2008 | Vadi | G11C 29/028 365/185.07 |
| 2006/0186907 A1 * | 8/2006 | Haetty | G01R 31/3004 324/754.03 |

(Continued)

*Primary Examiner* — Toan K Le
(74) *Attorney, Agent, or Firm* — JCIPRNET (57) ABSTRACT

The disclosure is related a method for testing and measuring the performances of electrical components on a semiconductor IC device through a test apparatus (also referred to as a testline) disposed in a scribe line between the semiconductor IC devices on a wafer. The test apparatus may include a built-in self-test (BIST) circuit and a duplication of the electrical components subjected to the performance measurement. Minimum and maximum testing voltages are provided to the test apparatus, where the range of voltage between the minimum and maximum testing voltages are divided into a plurality of testing operational voltages which are applied to the test apparatus. For each testing operational voltages, a memory array operation test is performed, where at least one of the testing operational voltages resulting in a performance failure is identified as the minimal operating voltage of the memory array.

20 Claims, 6 Drawing Sheets

(51) Int. Cl.
*G11C 29/50* (2006.01)
*G01R 31/26* (2014.01)
*G11C 29/38* (2006.01)

(56) References Cited

U.S. PATENT DOCUMENTS

| 2009/0058438 A1* | 3/2009 | Ku | G01R 31/2851 |
| | | | 324/750.3 |
| 2010/0232242 A1* | 9/2010 | Deng | G11C 29/023 |
| | | | 365/201 |
| 2012/0161780 A1* | 6/2012 | Choi | G01R 31/2879 |
| | | | 324/537 |

* cited by examiner

APPARATUS AND METHOD FOR MEASURING PERFORMANCE OF MEMORY ARRAY

CROSS-REFERENCE TO RELATED APPLICATION

This application claims the priority benefit of U.S. provisional application Ser. No. 62/551,248, filed on Aug. 29, 2017. The entirety of the above-mentioned patent application is hereby incorporated by reference herein and made a part of this specification.

BACKGROUND

Semiconductor integrated circuit (IC) devices are formed on a semiconductor wafer, and typically includes basic electrical components, such as transistors, resistor, capacitors, and the like. The fabricated components are then interconnected through deposited layers, or the like, to form logic, or other functions. The semiconductor IC devices are typical arranged in a grid pattern and separated by scribe lines. Once the formation of semiconductor IC devices is completed, the semiconductor wafers are diced into individual semiconductor IC devices (also known as dies). The dicing operation involves scribing the scribe line between the rows and columns of the IC devices on the semiconductor wafer. Since scribe line are cut off at the end of process, manufactures usually layout test pads and circuits in the scribe line area as to monitor the fabrication process during process control monitor (PCM), or to perform tests on the semiconductor IC devices during the wafer acceptance test (WAT).

Basic electrical characteristics of the semiconductor IC devices, such as resistance, capacitance, current, or the like, may be monitored during the fabrication process. In many applications, it is not practical or viable to test and obtain the performance of the semiconductor IC devices since there are not additional pinout or routing provided to the semiconductor IC devices for testing. For example, the semiconductor IC devices may belong to third party, where modification are not allowed. Therefore, the performances are tested after the semiconductor ICs are packaged via package terminals. However, it is desired to test and measure the performance of the semiconductor ICs throughout the fabrication process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following, various embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Exemplary embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The disclosure is related a method for testing or obtaining the performances of electrical components on a semiconductor IC device through a test apparatus (also referred to as a testline) disposed in a scribe line between the semiconductor IC devices on a wafer.

Figure 1A:
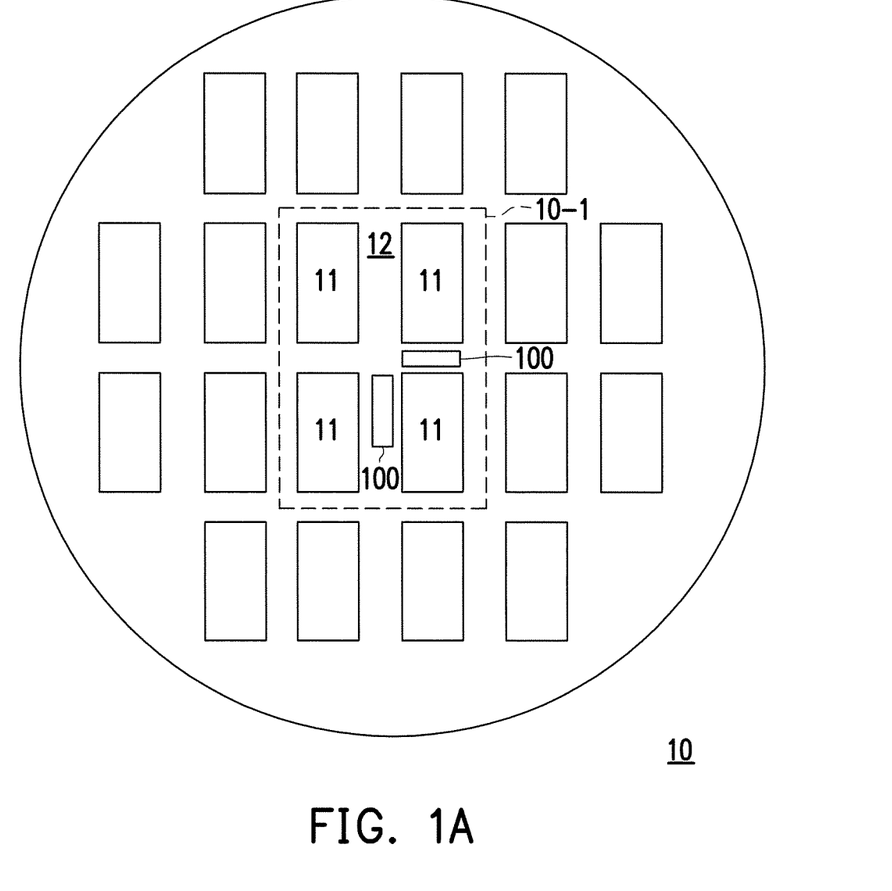
FIG. 1A is a plan view of a semiconductor wafer with semiconductor IC devices separated by scribe lines according to some exemplary embodiments of the disclosure.

FIG. 1A is a plan view of a semiconductor wafer 10 with semiconductor IC devices 11 separated by scribe lines 12 according to some exemplary embodiments. The semiconductor IC devices 11 are arranged into rows and columns and separated by the scribe lines 12 horizontally and vertically. Further, FIG. 1A also illustrates a test apparatus 100 disposed in the scribe lines 12 between the semiconductor IC devices 11. It should be noted that, due to the physical dimension of the scribe lines 12, which is usually in the range of micrometers for example, the exemplary test apparatus 100 is designed to have a long and narrow structure. FIG. 1A is utilized for the purpose of illustration only, and the location, orientation, dimension and arrangement of the test apparatus 100 in the scribe lines 12 may vary based on the design requirements or other needs of a designer.

As introduced above, one of the difficulties is to measure the performance of some electrical components in the semiconductor IC device 11, since it is not practical or viable to add pinout for accessing the electrical components, or routing the electrical components to the scribe lines for testing. Taking Static Random Access Memory (SRAM) as an example, basic electrical characteristics of SRAM, such as resistance, capacitance, voltage and current of the transistors of SRAM may be measured. However, the performances and operation of the SRAM cells, such as read and write performance, minimal operating voltage (Vcc_min), and the like, are not being monitored, tested or measured in the process control monitor (PCM) or wafer acceptance test (WAT). For a SRAM having 6-transistor configuration, the performance of the SRAM requires operation of all 6 transistors as to read and write. Verification of whether SRAM cells are successfully written and measurement of a minimal operating voltage of the SRAM cells would require additional circuit configuration and process than having test pads in the scribe lines. In the above, SRAM is utilized for as an exemplary memory array for the purpose of explanation. However, the embodiments of the disclosure are not limited thereto, in other exemplary embodiments, the memory array may be dynamic random access memory (DRAM), Magnetic random access memory (MRAM), and any type of memory array.

In some exemplary embodiments, the semiconductor IC devices may be any devices including memory array, such as a logic control circuit, processor, application-specific integrated circuit (ASIC), and the like. It is desired to test the operation of the memory array and measure the performance of the memory array during the fabrication process, or before packaging stage.

Figure 1B:
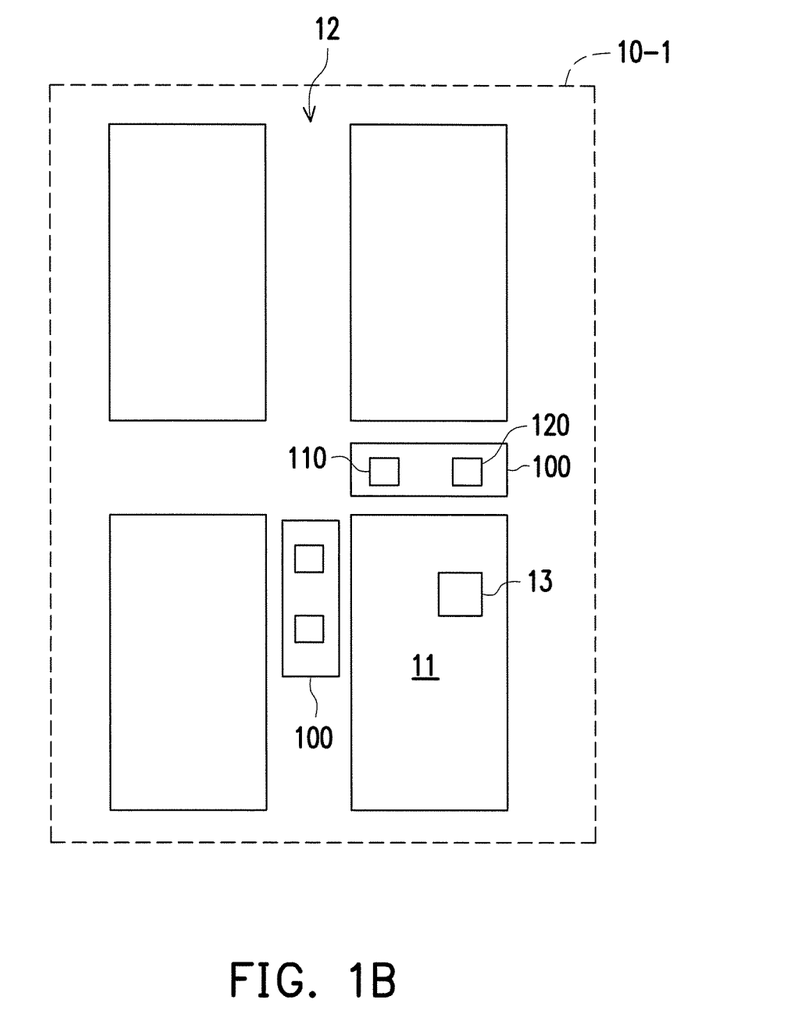
FIG. 1B is an enlarged view of a region of the semiconductor wafer illustrated in FIG. 1 according to some exemplary embodiments of the disclosure.

FIG. 1B is an enlarged view of a region 10-1 of the semiconductor wafer 10 illustrated in FIG. 1 according to some exemplary embodiments of the disclosure. With reference to FIG. 1B, the semiconductor IC device 11 includes a memory array 13 as an electrical component of the semiconductor IC device 11. In addition, an exemplary test apparatus 100 including a built-in self-test circuit 110 and a memory array 120 is illustrated. The exemplary test apparatus 100 illustrated in FIG. 1B is simplified for the illustration of a relationship between the memory array 13 and memory array 120, detail of the test apparatus 100 would be further described later. In the exemplary embodiments, the memory array 120 in the test apparatus 100 is a duplication (or reproduction) of the layout of the memory array 13 disposed in the semiconductor IC device 11. However, it is not intended to limit the scope of the disclosure. In other exemplary embodiments, the memory array 120 in the test apparatus 100 may be a smaller array of memory cells representing the memory array 13 in the semiconductor IC device 11. For example, the memory array 120 may be a duplication of a portion of the memory array 13 (e.g., 1K SRAM memory array.) Since the memory array 120 and the memory array 13 are fabricated on the same wafer via similar fabrication process, the performance of the memory array 13 on the semiconductor IC device 11 may be measured by testing the memory array 120.

Figure 2A:
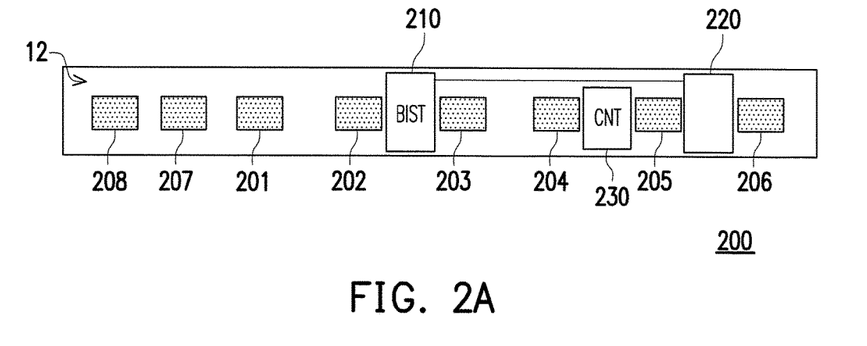
FIG. 2A is a diagram illustrating a test apparatus disposed in the scribe line 12 according to some exemplary embodiments of the disclosure.

FIG. 2A is a diagram illustrating a test apparatus 200 disposed in the scribe line 12 according to some exemplary embodiments of the disclosure. For the purpose of illustration, the test apparatus 200 would be illustrated in term of the circuit block diagram in FIG. 2B, which is a circuit block diagram illustrating the test apparatus 200 according to some exemplary embodiments of the disclosure.

With reference to FIG. 2A; the test apparatus 200 may include a plurality of test pads 201-208, a built-in self-test (BIST) circuit 210, a memory array 220, and a counter 230. In the exemplary embodiments, the test pads 201-208, the memory array 220, and the counter 230 are electrically connected to the BIST circuit 210 through deposited metal layers or traces. The test pads 201-208 are utilized to receive or output signals for probing at different stage of fabrication process or wafer acceptance test (WAT).

The BIST circuit 210 may be logic circuit programmed to perform various operations to the memory array 220 during the WAT. For example, the BIST circuit 210 may be programmed to perform operations, such as write, read, compare, and the like, to the memory array 220. In the exemplary embodiments, the BIST circuit 210 is programmed to perform a minimal operating voltage detection on the memory array 220. However, the disclosure is not limited by the measurement described here, various measurement may be performed via the BIST circuit 210 as to monitor or test the memory array 220 during the fabrication process or WAT.

The counter 230 may be utilized to count the cycles based on a clock signal received from one of the test pads 201-208 and provided to the BIST circuit 210, where the BIST circuit delays to various operations of the BIST circuit 210 accordingly.

Figure 2B:
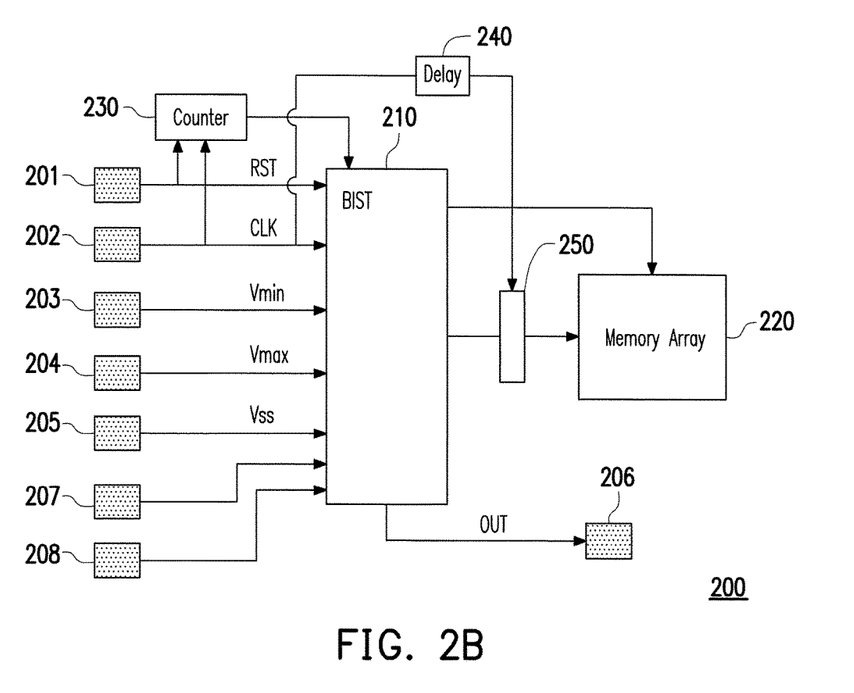
FIG. 2B is a circuit block diagram illustrating a test apparatus according to some exemplary embodiments of the disclosure.

With reference to FIG. 2B, the BIST circuit 210 is electrically connected the first test pad 201 and second test pad 202 to receive a reset signal RST and a clock signal CLK, respectively. The BIST circuit 210 is also electrically connected to the third test pad 203, the fourth test pad 204, and the fifth test pad 205 to receive a minimum testing voltage Vmin, a maximum testing voltage Vmax and a reference voltage Vss (also known as a ground), respectively. In the exemplary embodiments, the BIST circuit would perform the minimal operating voltage detection on the memory array 220, and then output a voltage level to the sixth test pad 206 for a testing equipment to read, where the output voltage level would be referred to as a minimal operating voltage of the memory array 220. The minimal operating voltage detection performs a sequence of write, read, and compare operations to the memory cells.

In the exemplary embodiments, the reset signal RST may be a signal that resets the counter 230 and all operations of BIST 210 and act as a trigger that initializes the minimal operating voltage detection of the memory array 220. The minimum testing voltage Vmin, the maximum testing voltage Vmax and the reference voltage Vss are voltage inputs that allows the BIST circuit 210 to perform the minimal operating voltage detection on the memory array 220. In detail, the minimum testing voltage Vmin and the maximum testing voltage Vmax provide a range of operating voltages for the BIST circuit 210 to test the operational performance of the memory array 220. The range of operating voltages may be divided into a plurality of testing operating voltages. For example, the minimum testing voltage Vmin may be 0.8V, and the maximum testing voltage Vmax may be 1.2V. The range of the minimum testing voltage Vmin and the maximum testing voltage Vmax would 0.8V-1.2V, however, the disclosure is not intended to limit the range of testing voltage. The BIST circuit 210 would divide this range of 0.8V-1.2V into N different testing voltages, where N is a positive integer. In the exemplary embodiments, N different testing voltages may be 32 testing voltages, such as 0.8125V, 0.825V, 0.8375, and so on. For each testing voltages, the BIST circuit 210 would supply the selected testing voltage to the memory array 220 as the operating voltage of the memory array 220 and perform writing, reading, and comparing operations to each cell in the memory array 220. Accordingly, the minimal operating voltage of the memory array 220 may be obtained when a failure in the write-read-compare operation is detected while one of the testing voltages is being supplied to the memory array 220. Further detail of the minimal operating voltage detection would be discussed later.

Figure 3:
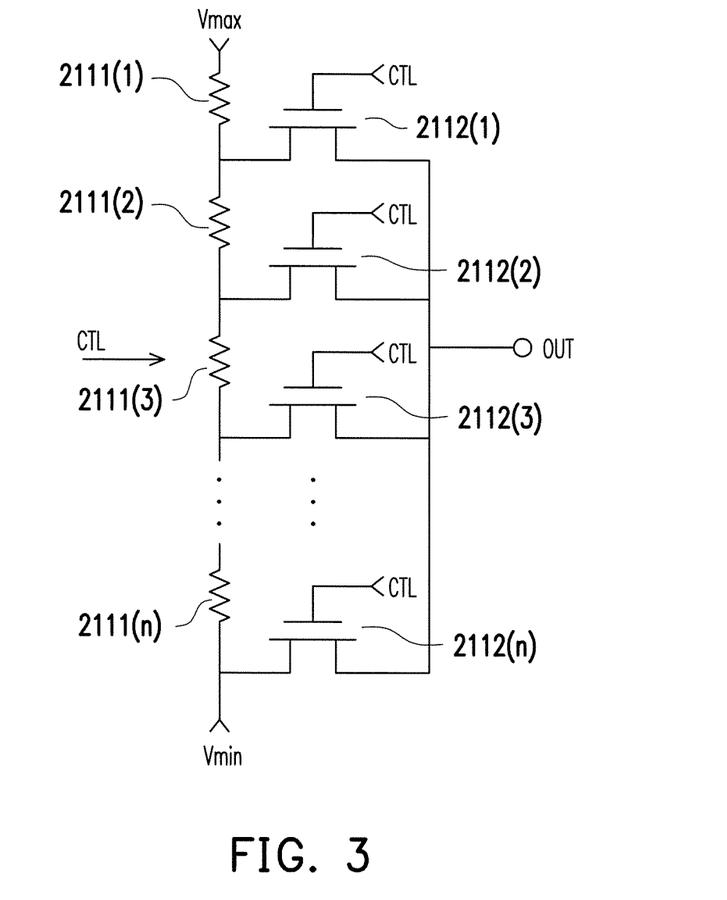
FIG. 3 is a circuit diagram illustrating a voltage divider according to some exemplary embodiments of the disclosure.

In order to divide the range of voltages between the minimum testing voltage Vmin and the maximum testing voltage Vmax, the BIST circuit 210 may include a voltage divider 211. FIG. 3 is a circuit diagram illustrating a voltage divider 211 according to some exemplary embodiments of the disclosure. The voltage divider 211 may include resistors 2111(1)-2111(n) and transistors 2112(1)-2112(n). The resistors are connected in series between the minimum testing voltage Vmin and the maximum testing voltage Vmax, and the intersection between every two resistors (e.g., resistors 2111(1) and 2111(2)) are connected to one transistor (e.g., transistor 2112(1)) in parallel. In other words, one end of the exemplary transistor may be connected to the intersection between the two resistors (e.g., intersection of the resistors 2111(1) and 2111(2)), and another end of the transistor may be connected to an output of the voltage divider 211. The internal logic of the BIST circuit 210 is connected to the control terminal of the transistors as to enable or disable of the transistors. Through the operation of the transistors, an impedance ratio between the series impedances between the minimal and maximum testing voltages Vmin, Vmax may be change for generating different testing voltages between the minimal and maximum testing voltages Vmin, Vmax. The generated testing voltage is then provided to the memory array 220 as an operating voltage powering the operation of the memory array 220 through the output of the voltage divider 211.

It should be noted that, due to the long and narrow structure of the test apparatus 200, the distance between the BIST circuit 210 and the memory array 220 would cause signal delays. To account this signal delay, a delay is added to ensure that the test data pattern is successfully transmitted before writing to the memory array. In some exemplary embodiments, the test apparatus 200 further includes a delay circuit 230 and a data storage circuit 240. The delay circuit 230 may be delay chain having an input coupled to the clock signal and an output coupled to the data storage circuit 240. The data storage circuit 240 may be, for example, a flip-flop, register, or the like to store incoming data. In the exemplary embodiment, the incoming data may be the test data pattern outputted by the BIST circuit 210. Due to the long and narrow structure, it may take a long period of time for the test data pattern to be transmitted from the BIST circuit 210 to the memory array 220, or each bit of the test data pattern may not arrive the memory array 220 at the same time. Therefore, the data storage circuit 240 is placed in front of the memory array 220 to first store and hold the test data pattern, instead of allowing the test data pattern to be written to the decoder or encoder of the memory array directly. In the exemplary embodiment, the delay circuit 230 is designed to delay for a period of time that would allow the signal representing each test data pattern to have sufficient time to travel from the BIST circuit 210 to the data storage circuit 240, and then enables the data storage circuit 240 to output the received test data pattern. Since the data storage circuit 240 may be disposed at a location close to the memory array 230, the test apparatus may ensure that all of the test data apparatus is received and written to the memory array. At the same time, this delay may also prevent errors in read data. For example, without the above delay mechanism, data may be read before the test data pattern is written to the memory array 220. In other words, the read operation may be performed before every bits of the test data pattern are written to memory array subjected to the operation test, which causes an inaccurate detection of failure operating voltage. The write-read-compare operation may be performed before every bits of the test data pattern had a chance to be written to its respective memory cells due to the delay caused by the long and narrow structure of the test apparatus 200. Therefore, in the exemplary embodiment, the received data is being hold in the data storage circuit 250 for the predetermined period of time before writing to the memory array. The control of the data storage circuit 250 is based at least in part on the output of the delay circuit 240. The predetermined period may be designed or configured according to the signal delay, the distances between the memory array 220 and the BIST circuit 210, etc. The disclosure is not intended to limit the wait time set by the predetermined period of tie.

In the following, the operation of the minimal operating voltage detection of the memory array 220 would be described in detail with reference to the elements described above.

Figure 4:
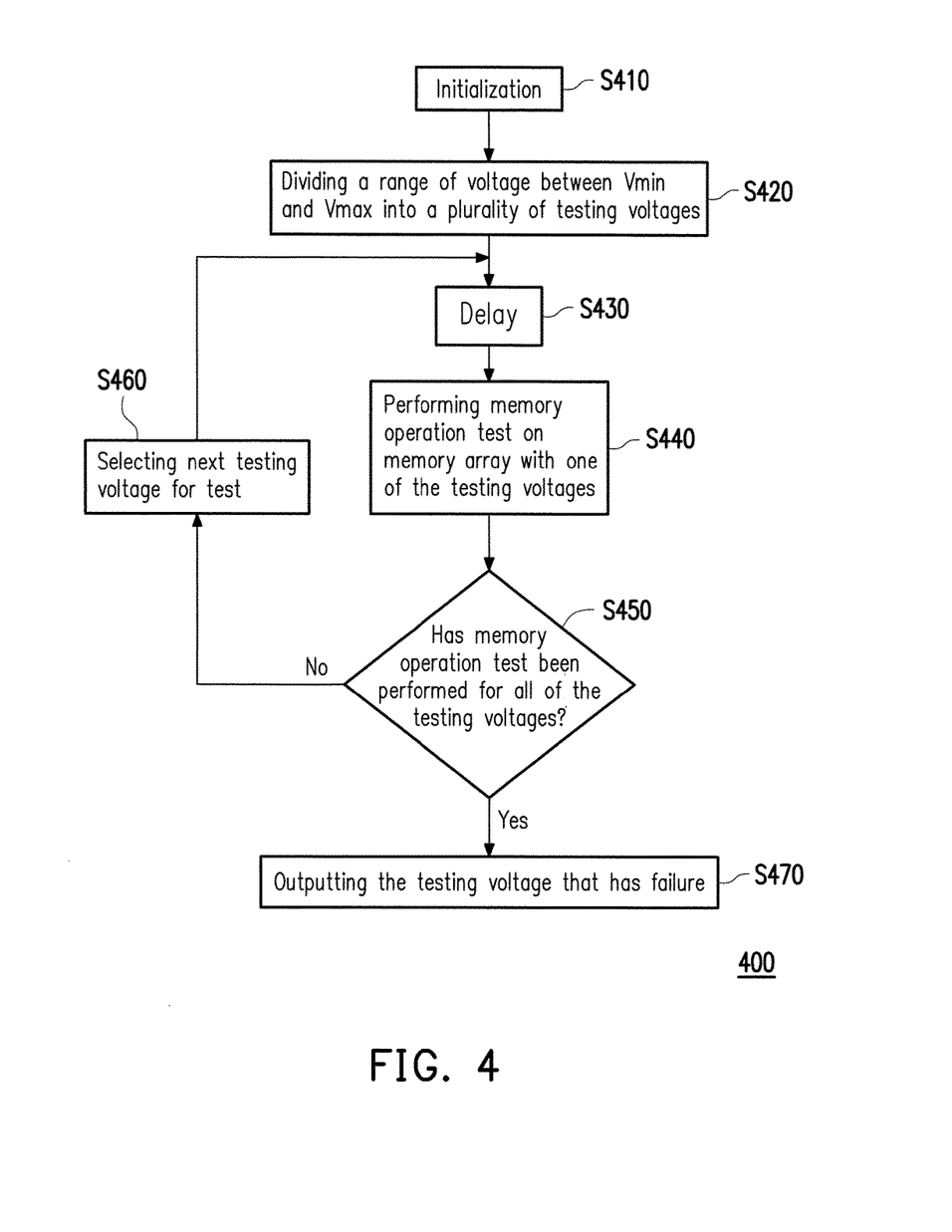
FIG. 4 is a flow chart illustrating a process flow of the minimal operating voltage detection according to some exemplary embodiments of the disclosure.

FIG. 4 is a flow chart illustrating a process flow of the minimal operating voltage detection 400 according to some exemplary embodiments of the disclosure. In step, S410, the operation of the BIST circuit 210 and counter 230 would be initialized.

In step S420, the BIST circuit 210 would divide a range of voltage between the received minimum and maximum testing voltages Vmin, Vmax into a plurality of testing voltages. In detail, the BIST circuit 210 may be programmed to control the operation of the transistors 2112(1)-2112(n) as to divide the range of voltage between the received minimum and maximum testing voltages Vmin, Vmax through the resistors 2111(1)-2111(n) into a plurality of testing voltages.

In step 430, the BIST circuit 210 is programmed to wait for a period of delay time generated by the counter 230 between each memory array operation test. This delay time may be a predetermined time delay that considers the amount of time for the memory array 220 would take to discharge to avoid any switching glitch. In the exemplary embodiments, the exemplary delay time of step 440 may be 2048 cycles. However, it is not intended to limit the disclosure, various delay time may be implemented according to the design requirement, such as distance between the BIST circuit 210 and the memory array 220.

In step S440, the BIST circuit 210 performs a memory array operation test on the memory array 220 while one of the testing voltages is being provided as the operating voltage of the memory array 220. During the memory array operation test, the BIST circuit 210 is programmed to write a data pattern into the memory cells of the memory array 220, read the memory cells of the memory array 220, and compare the read data pattern with the written data pattern as to determine any failure in the memory array 220. Details of the memory array operation test would be described later with reference to FIG. 5.

In step S450, the BIST circuit 210 determines whether the memory array operation test has been performed for all of the testing voltages. If yes, the process would go to step S470. If no, the process would go to step S460.

In step S460, the BIST circuit 210 would select the next testing voltage for performing the memory array operation test. In the exemplary embodiments, the BIST circuit 210 may be programmed to control the transistors 2112(1)-2112(n) to generate the next testing voltage and output the testing voltage to the memory array 220. In the exemplary embodiments, the memory array operation test may be started from the maximum testing voltage and reduced toward the minimum testing voltage.

In step S470, the BIST circuit 210 would output a testing voltage that had a failure (referred to as failure testing voltage hereafter) during the memory array operation test to the fifth testing pad. In the exemplary embodiments, the BIST circuit 210 would record the failure testing voltage in the data storage circuit 213. In the case where failure has occurred for multiple testing voltages, the first recorded failure testing voltage would be output. Since the memory array operation test would start at the maximum testing voltage, the first recorded failure testing voltage would be the minimal operating voltage of the memory array 220, as well as the memory array 13 in the semiconductor device 11.

Figure 5:
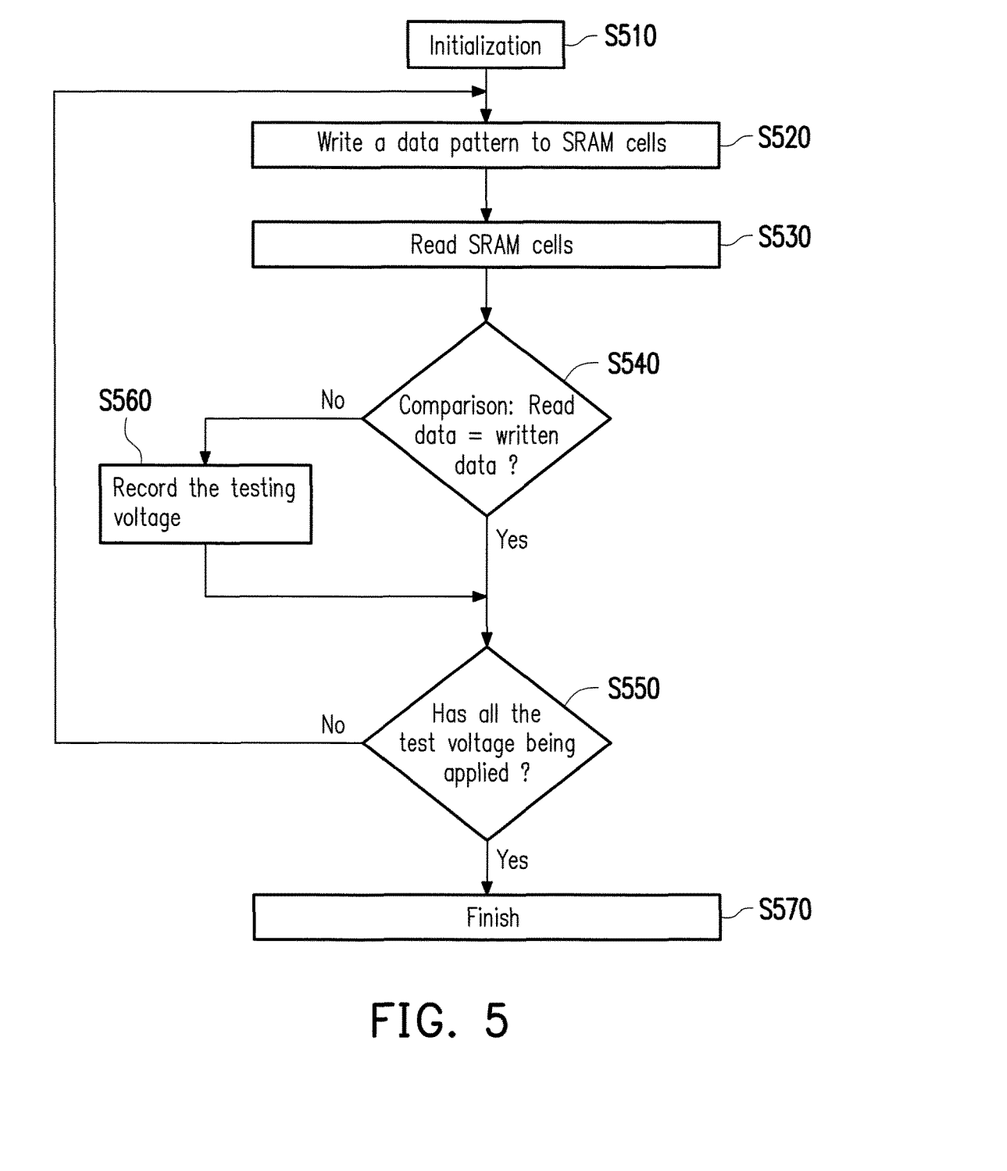
FIG. 5 is a flow diagram illustrating a memory array operation test according to some exemplary embodiments of the disclosure.

In the following, the memory array operation test would be described in detail. FIG. 5 is a flow diagram illustrating a memory array operation test according to some exemplary embodiments of the disclosure. In step S510, the process is initiated. In some exemplary embodiments, the initialization may include writing "0" to all memory cells in the memory array 220. In other exemplary embodiments, the initialization may write "1" to all memory cells in the memory array 220, the disclosure is not limited to the logic state to which the memory cell configured to by the writing operations.

In step S520, the BIST circuit 210 performs a writing operation to write a test data pattern into the memory array 220. The testing data pattern would be different from the initial data pattern. It should be noted that the term data pattern, such as a sequence of "1" and/or "0", is being utilized here to indicate an address including a plurality of bits (memory cells) that are being read or written at the same time.

In step S530, the BIST circuit 210 performs a reading operation to obtain a read data pattern from the memory cells.

In some exemplary embodiments, the writing operation S520 may further includes a delay step before the reading operation S530, so as to ensure that the write data pattern has sufficient time travel through the long and narrow structure of the test apparatus described above before reading a data pattern output of the memory array.

In step S540, the BIST circuit 210 performs a comparing operation to compare the read data pattern and the test data pattern (expected data), so as to determine whether there is a failure. If yes, the process would go to step S550. If no, the process would go to step S560.

In some exemplary embodiments, the writing and reading operations would be performed from the most significant bit to the least significant bit for a number of times, and then from the least significant bit to the most significant bit for a number of times.

In step S550, the BIST circuit 210 determines whether all of the testing voltages have been applied to the memory array 220. In yes, the process would go to S570 to finish the memory array operation test. If no, the process would go back to the beginning, for example, before the step S520, to test the memory array 220 with the subsequent testing voltage. In other words, the process would be in a loop until the memory array 220 are been tested with all of the testing voltages. In the exemplary embodiments, as the BIST circuit 210 determines that the memory array 220 has not been tested with all of the testing voltage, the BIST circuit would configure the voltage divider 211 so that the BIST circuit 210 may output the subsequent testing voltage to test the memory array 220.

In step S560, the memory array operation test detected a failure has occurred. For example, the read data pattern does not match the written data pattern. In other words, the operating voltage currently provided to the memory array may be insufficient to provide enough power to ensure the proper operations of the transistors. The BIST circuit 210 would utilize the data storage circuit 213 to record one bit indicating the testing voltage for which the failure has occurred. Then, the process would go to S550 to determine whether the memory array 220 has been tested with all of the testing voltages.

Based on the above, the performance and operation of memory array may be monitored throughout the fabrication process, and the minimal operating voltage of the memory array may be detected by utilizing the exemplary test apparatus in the scribe line.

Furthermore, the exemplary test apparatus may be utilized in the research and development stage to do memory cell splits with less area penalty. In some exemplary embodiments of the disclosure, a plurality of test apparatus 200 may be disposed in the die area of the wafer which memory array be referred to as a test vehicle. Each test apparatus in the die area may include memory array having different structure. For example, a distance between at least two transistors sharing the same trace as gate terminal may be tampered with. In a test apparatus, the distance may be 10 micrometers. In another test apparatus, the distance may be 20 micrometers. Then, the memory array operation test may be performed on both test apparatuses. Based on the result of the memory array operation test, one may determine which one of the memory array structure would have optimal performance. In other words, the exemplary test apparatus provides a way to look ahead (i.e., the performance) at the research and development stage before production.

According to some embodiments, a method for detecting minimal operation voltage of memory array is provided. Minimum testing voltage and maximum testing voltage are received, where a range of voltages between the minimum testing voltage and the maximum testing voltage is divided into a plurality of testing voltages. Then, the memory array operation test is performed on the memory array for each of the testing voltages, wherein the testing voltages are provided for operating the memory array. Occurrence of failure in the memory array may be detected in a failure memory array operation test. Then, the testing voltage corresponding to the failure memory array operation test is outputted as a minimal operation voltage of the memory array.

According to some embodiments, a method of measuring a performance of a memory array is provided. In the method, a plurality of testing operational voltages are applied to the memory array. For each of the testing operational voltages, a writing operation to write an expected data pattern to the memory array, a reading operation to the memory array to obtain a read data pattern, and a comparing operation to compare the read data pattern to the expected data pattern for determining a performance failure are performed in a sequence.

According to some embodiments, a test apparatus is disposed in a scribe line of wafer. The test apparatus includes a first test pad and a second test pad, where a minimum testing voltage is received through the first test pad, and a maximum testing voltage is received through the second test pad. The test apparatus also includes a memory array and a built-in self-test (BIST) circuit. The BIST circuit is electrically connected to the test pads and the memory array. The BIST circuit divides a range of voltages between the minimum testing voltage and the maximum testing voltage into a plurality of testing voltages, and programmed to perform a memory array operation test on the memory array for each of the testing voltages, detecting an occurrence of failure in the memory array in a failure memory array operation test, and outputting the testing voltage corresponding to the failure memory array operation test as a minimal operation voltage of the memory array through a third test pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting minimal operation voltage of memory array, comprising:
   receiving a minimum testing voltage and a maximum testing voltage;
   dividing a range of voltage between the minimum testing voltage and the maximum testing voltage into a plurality of testing voltages;
   performing a memory array operation test on the memory array for each of the testing voltages, wherein the testing voltages are provided for operating the memory array;
   detecting an occurrence of failure in the memory array in a failure memory array operation test; and
   detecting at least one of the testing voltages utilized for operating the memory array during the detected failure memory array operation test.

2. The method of claim 1, further comprising:
   outputting the testing voltage utilized for operating the memory array during the detected failure memory array operation test as the minimal operation voltage of the memory array.

3. The method of claim 1, further comprising:
   delaying for a predetermined number of cycles before performing each SRAM performance test.

4. The method of claim 1, wherein the memory array operation test comprises:
   writing a first data pattern to the memory array;
   reading a second data pattern to the memory array;
   comparing the second data pattern to the first data pattern; and
   determining that a failure has occurred in the memory array when the second data pattern and the first data pattern does not match.

5. The method of claim 4, wherein the memory array operation test further comprises:
   recording at least one of the testing voltages utilized for operating the memory array during the detected failure memory array operation test.

6. The method of claim 4, wherein the memory array operation test further comprises:
   delaying the writing of first data pattern to the memory array as to compensate a signal delay generated by propagation of a signal through a long and narrow structure.

7. A method of measuring an operation of a memory array, comprising:
   applying a plurality of testing operational voltages to the memory array;
   for each of the testing operational voltages,
      performing a writing operation to write an expected data pattern to the memory array;
      performing a reading operation to the memory array to obtain a read data pattern; and
      performing a comparing operation to compare the read data pattern to the expected data pattern for determining a performance failure.

8. The method of claim 7, comprising:
   recording at least one of the operational testing voltages at which the performance failure was detected.

9. The method of claim 7, comprising:
   outputting the at least one of the operational testing voltages at which the performance failure was detected as a minimal operating voltage of the memory array.

10. The method of claim 9, wherein the outputted operational testing voltage is the first operational testing voltage at which the performance failure is detected.

11. The method of claim 7, comprising:
    delaying the writing operation to the memory array as to compensate a signal delay generated by propagation of a signal through a long and narrow structure.

12. A test apparatus, disposed in a scribe line of wafer, comprising:
    a first test pad, receiving a minimum testing voltage;
    a second test pad, receiving a maximum testing voltage
    a memory array;
    a built-in self-test (BIST) circuit, electrically connected to the test pads and the memory array, dividing a range of voltage between the minimum testing voltage and the maximum testing voltage into a plurality of testing voltages, and programmed to perform the following steps:
       respectively performing a memory array operation test on the memory array for each of the testing voltages, wherein the testing voltages are provided for operating the memory array;
       detecting an occurrence of a failure in the memory array in a failure memory array operation test; and
       outputting the testing voltage corresponding to the failure memory array operation test as a minimal operation voltage of the memory array through a third test pad.

13. The test apparatus of claim 12, further comprises:
    a delay circuit, coupled to a clock signal; and
    a data storage circuit, coupled between the BIST circuit and the memory array, and configured to receive test data pattern from the BIST circuit and output the test data pattern to the memory array based on the output of the delay circuit.

14. The test apparatus of claim 12, wherein the memory array is a duplication of a portion of the memory array disposed in the die area.

15. The test apparatus of claim 12, further comprising
    a counter, counting cycles of a clock signal,
    wherein the BIST circuit is programmed to delay for a predetermined number of cycles before performing each memory array operation test.

16. The test apparatus of claim 12, wherein the BIST circuit further comprises a voltage divider, sequentially outputting one of the testing voltages to operate the memory array.

17. The test apparatus of claim 16, wherein the voltage divider comprises:
   a plurality of resistors, connected in series, wherein one terminal of the serially connected resistors is electrically connected to the first test pad, and another terminal the serial connected resistors is electrically connected to the second test pad; and
   a plurality of transistors, wherein each transistor is electrically connected between an intersection of two resistors and an output terminal of the voltage divider, and controlled by the BIST circuit to divide the range of voltage between the minimum and maximum testing voltages in to N number of testing voltages.

18. The test apparatus of claim 12, where the test apparatus is a long and narrow structure.

19. The test apparatus of claim 12, wherein, in the memory array operation test for each testing voltage, the BIST circuit is programmed to perform the following steps:
   applying a plurality of testing operational voltages to the memory array;
   for each of the testing operational voltages,
      performing a writing operation to write an expected data pattern to the memory array;
      performing a reading operation to the memory array to obtain a read data pattern; and
      performing a comparing operation to compare the read data pattern to the expected data pattern for determining at least one of the testing voltages for which the failure operation test is detected.

20. The test apparatus of claim 19, wherein the BIST circuit is further programmed to delay the reading operation to the memory array after the writing operation for a predetermined period of time.

* * * * *